United States Patent
Chu et al.

(10) Patent No.: US 10,622,250 B2
(45) Date of Patent: Apr. 14, 2020

(54) DIELECTRIC GAP FILL EVALUATION FOR INTEGRATED CIRCUITS

(71) Applicant: International Business Machines Corporation, Armonk, NY (US)

(72) Inventors: Isabel Cristina Chu, Westchester, NY (US); Lawrence A. Clevenger, Rhinebeck, NY (US); Leigh Anne H. Clevenger, Rhinebeck, NY (US); Ekmini Anuja De Silva, Slingerlands, NY (US); Gauri Karve, Cohoes, NY (US); Fee Li Lie, Albany, NY (US); Nicole Adelle Saulnier, Albany, NY (US); Indira Seshadri, Niskayuna, NY (US); Hosadurga Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/286,072

(22) Filed: Feb. 26, 2019

(65) Prior Publication Data
US 2019/0189504 A1    Jun. 20, 2019

Related U.S. Application Data

(62) Division of application No. 15/847,005, filed on Dec. 19, 2017, now Pat. No. 10,312,140.

(51) Int. Cl.
*H01L 21/66*   (2006.01)
*H01L 21/768*  (2006.01)
(Continued)

(52) U.S. Cl.
CPC .... *H01L 21/76837* (2013.01); *H01L 21/3213* (2013.01); *H01L 21/76819* (2013.01);
(Continued)

(58) Field of Classification Search
CPC .............. H01L 21/76837; H01L 21/76819
See application file for complete search history.

(56) References Cited

U.S. PATENT DOCUMENTS

| 6,023,327 A  | 2/2000 | Shabde et al.      |
| 6,774,989 B1 | 8/2004 | Rangarajan et al.  |

(Continued)

FOREIGN PATENT DOCUMENTS

CN          102074488 A       5/2011

OTHER PUBLICATIONS

Lou et al., "Comparing Through-Silicon-Via (TSV) Void/Pinhole Defect Self-Test Methods," Journal of Electronic Testing, Feb. 2012, pp. 27-38, vol. 28, Issue 1, Springer, 12 pages.
(Continued)

*Primary Examiner* — Elias Ullah
(74) *Attorney, Agent, or Firm* — Amin, Turocy & Watson, LLP

(57) ABSTRACT

Apparatus and methods for dielectric gap fill evaluations are provided. In one example, a method can comprise providing a gap fill substrate over one or more interlayer dielectric trenches of a dielectric layer and over a first material located in the one or more interlayer dielectric trenches. The method can also comprise depositing a gap fill candidate material within one or more gap fill substrate trenches of the gap fill substrate. Furthermore, the method can comprise etching the gap fill candidate material until a void within the first material is identified. Additionally, the method can comprise filling the one or more gap fill substrate trenches with a second material to form one or more contacts with the first material to measure a leakage current of one or more pitches.

20 Claims, 10 Drawing Sheets

(51) Int. Cl.
*H01L 23/522* (2006.01)
*H01L 23/532* (2006.01)
*H01L 21/3213* (2006.01)

(52) U.S. Cl.
CPC .. *H01L 21/76877* (2013.01); *H01L 21/76892* (2013.01); *H01L 22/14* (2013.01); *H01L 23/5226* (2013.01); *H01L 23/53228* (2013.01)

(56) References Cited

U.S. PATENT DOCUMENTS

| | | |
|---|---|---|
| 6,943,569 B1 | 9/2005 | Pressley et al. |
| 7,973,309 B2 | 7/2011 | Kim et al. |
| 8,723,115 B2 | 5/2014 | Xiao et al. |
| 2005/0104063 A1 | 5/2005 | Hsu et al. |
| 2009/0283764 A1 | 11/2009 | Kim et al. |
| 2013/0341794 A1* | 12/2013 | Yu .......................... C25D 7/123 257/751 |

OTHER PUBLICATIONS

Office Action for U.S. Appl. No. 15/847,005 dated Oct. 4, 2018, 18 pages.
List of IBM Patents or Applications Treated as Related.

* cited by examiner

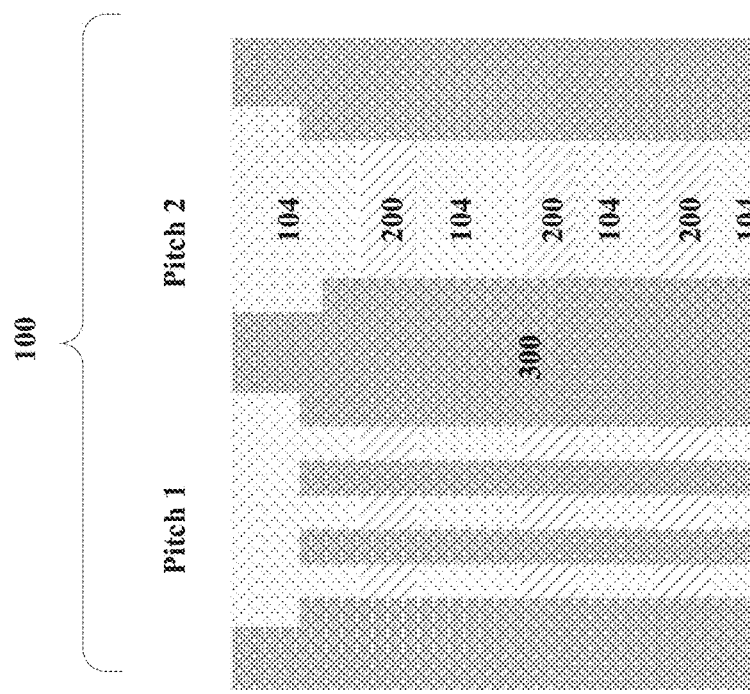
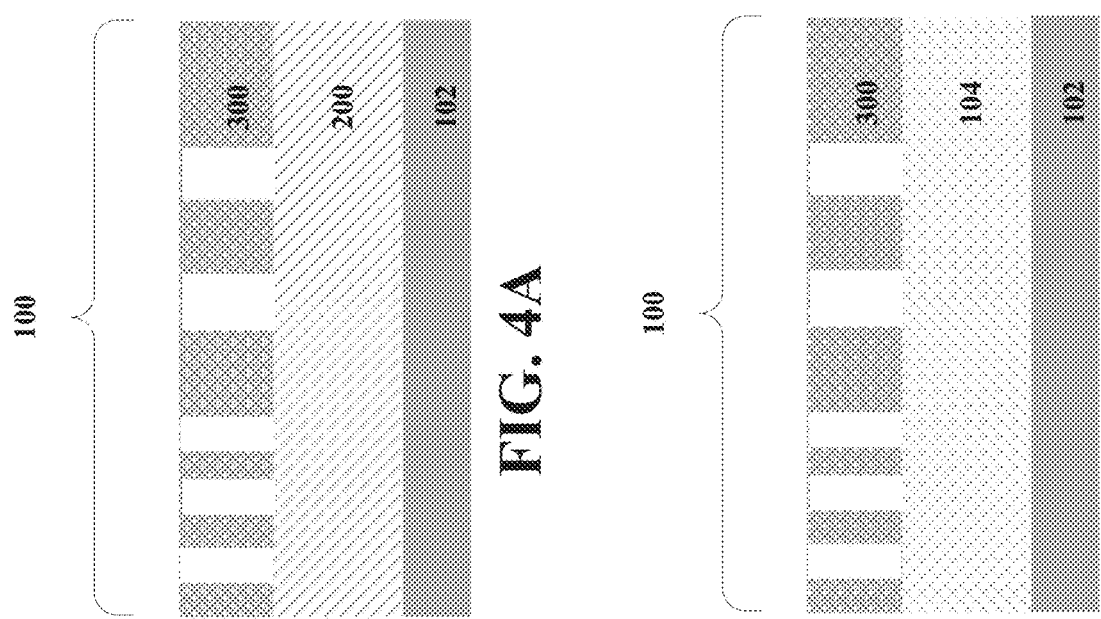

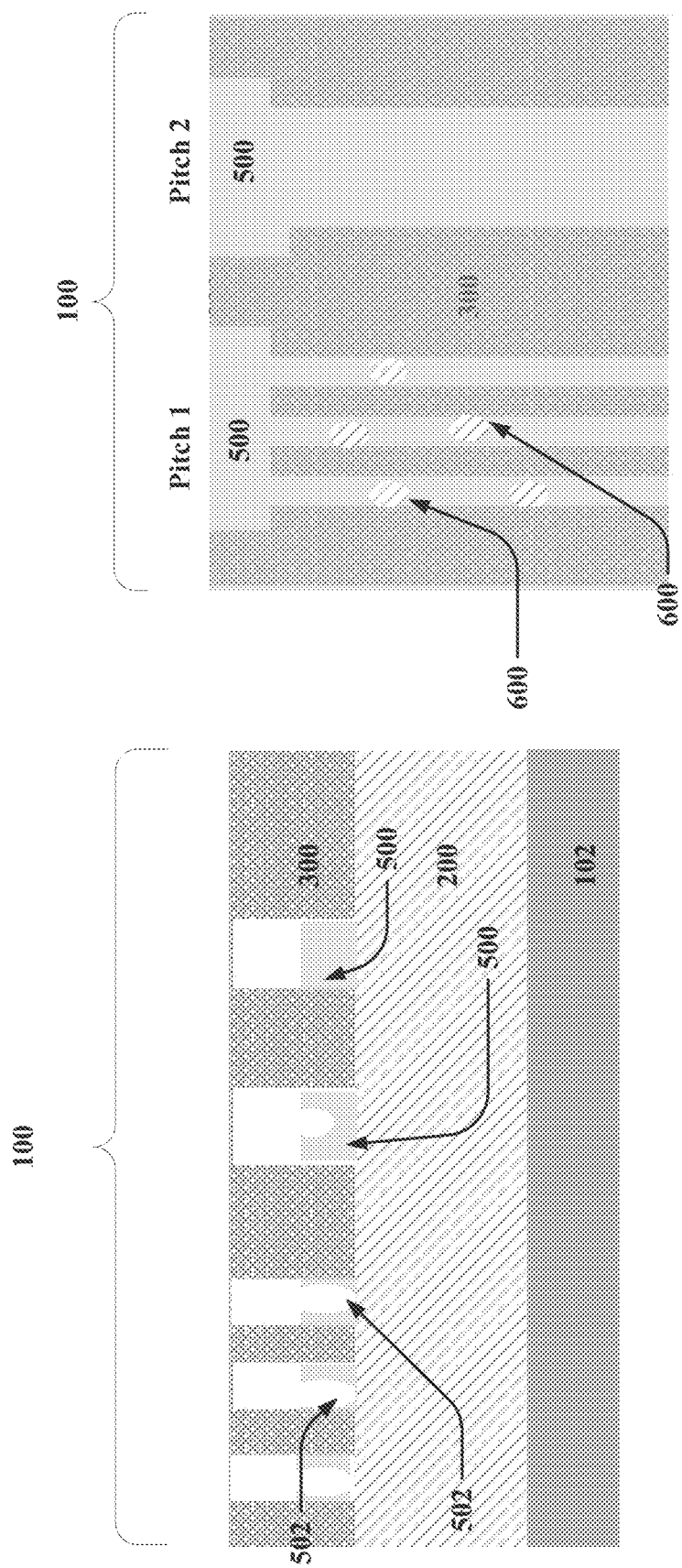

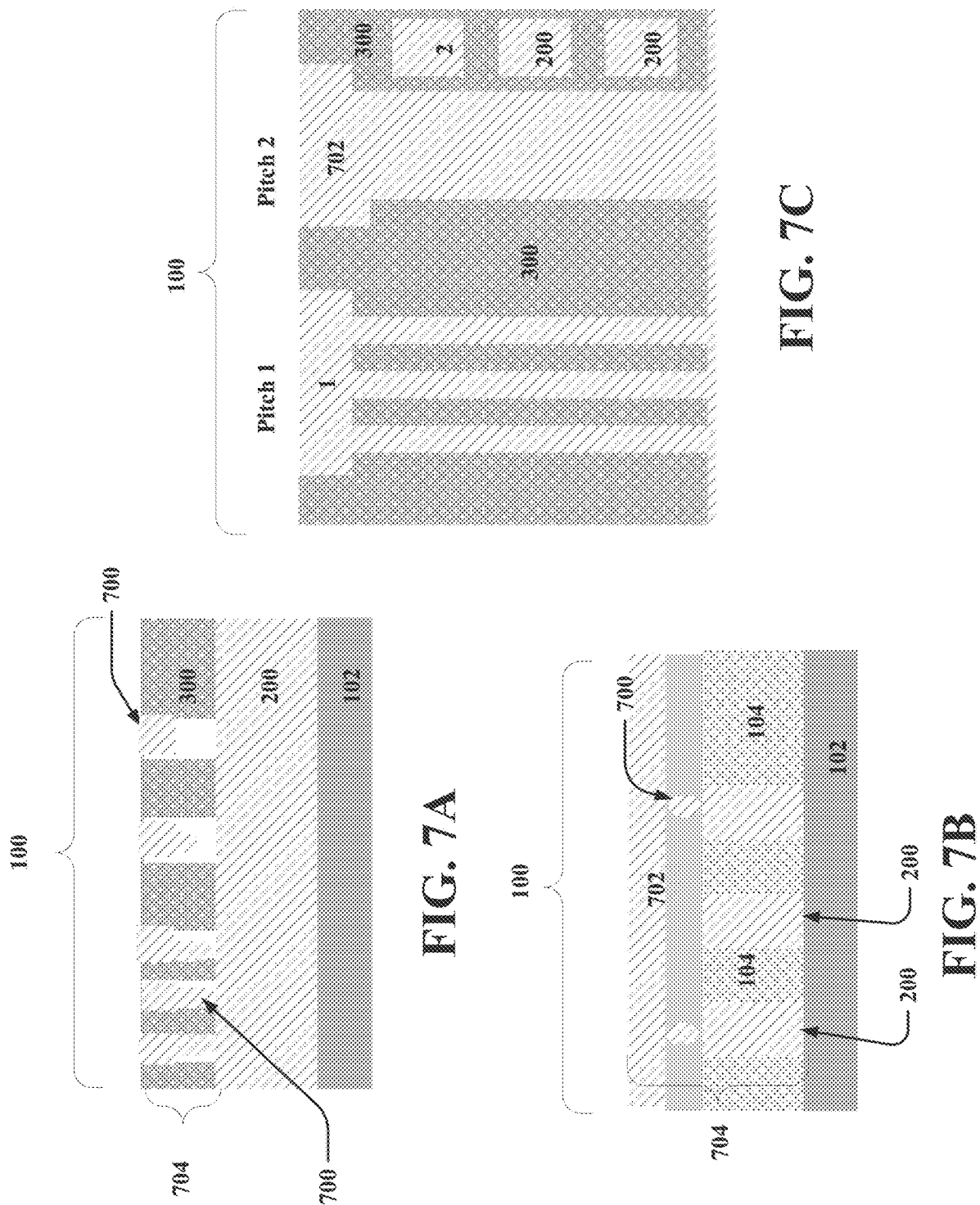

DIELECTRIC GAP FILL EVALUATION FOR INTEGRATED CIRCUITS

BACKGROUND

The subject disclosure relates to integrated circuit manufacturing, and more particularly to facilitate evaluation of void formation during dielectric gap fill.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods that facilitate void identification are described.

According to an embodiment, a method is provided. The method can comprise providing a gap fill substrate over one or more interlayer dielectric trenches of a dielectric layer and over a first material located in the one or more interlayer dielectric trenches. The method can also comprise depositing a gap fill candidate material within one or more gap fill substrate trenches of the gap fill substrate. Furthermore, the method can comprise etching the gap fill candidate material until a void within the first material is identified. Additionally, the method can comprise filling the one or more gap fill substrate trenches with a second material to form one or more contacts with the first material to measure a leakage current of one or more pitches.

According to another embodiment, an apparatus is provided. The apparatus can comprise a silicon substrate, an interlayer dielectric disposed on the silicon substrate, and a first metal within one or more first trenches of the interlayer dielectric. The apparatus can also comprise a gap fill substrate disposed on the first metal and the interlayer dielectric. Furthermore, the apparatus can comprise a dielectric gap fill material disposed within one or more second trenches of the gap fill substrate, and a second metal, wherein the second metal forms one or more contacts with the first metal According to yet another embodiment, another method is provided. Another method can comprise depositing an interlayer dielectric on a silicon substrate. Additionally, the method can comprise depositing a first metal within one or more interlayer dielectric trenches of the interlayer dielectric. The method can comprise etching a gap fill material, that has been deposited on a gap fill substrate disposed on the first metal and the interlayer dielectric, until a void within the gap fill material is reached. Furthermore, the method can comprise filling one or more gap fill substrate trenches with a second metal to form one or more contacts to measure a leakage current between the first metal and the one or more contacts.

These and other features and advantages will become apparent from the following detailed description of illustrative embodiments thereof, which is to be read in connection with the accompanying drawings.

DESCRIPTION OF THE DRAWINGS

The patent or application file contains at least one drawing executed in color. Copies of this patent or patent application publication with color drawing(s) will be provided by the Office upon request and payment of the necessary fee.

FIGS. 4A, 4B, and 4C illustrate non-limiting side views of the interlayer dielectric and a non-limiting top view of the interlayer dielectric comprising trenches, respectively, in accordance with one or more embodiments described herein.

FIGS. 6A and 6B illustrate a non-limiting side view of the interlayer dielectric and a non-limiting top view of the interlayer dielectric comprising an etched gap fill material, respectively, in accordance with one or more embodiments described herein.

FIGS. 7A, 7B, and 7C illustrate non-limiting side views of the interlayer dielectric and a non-limiting top view of the interlayer dielectric comprising copper fillings, respectively, in accordance with one or more embodiments described herein.

DETAILED DESCRIPTION

Figure 1:
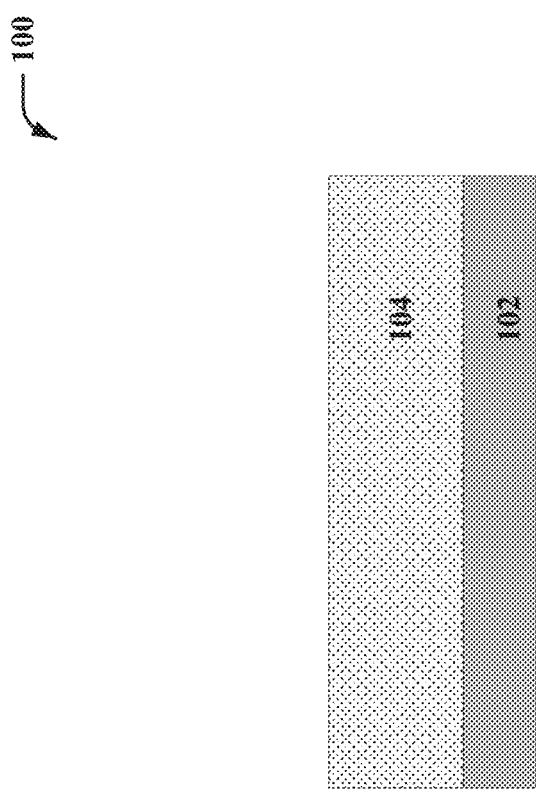
FIG. 1 illustrates a non-limiting side view of an interlayer dielectric on a silicon substrate in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Several complementary metal oxide semiconductor (CMOS) integration schemes require filling gaps with dielectric materials. Void formation is an issue when filling narrow high-aspect ratio gaps at tight pitches. Voids cause variability in reactive ion etch breakthrough that can be detrimental to yield and device performance. One or more embodiments described herein can enable statistically detecting dielectric gap fill material performance and voiding.

The process flow for wafer fabrication can be broken up into three major line cycles (e.g., front end, middle of the line, and back end). The front end line cycle begins from bare silicon to building up to a contact level for connections. The middle of the line begins to develop contacts on the top of the wafer, and when the middle of the line is complete, then the back end of the line can begin. The back end of the line cycle is where the metal lines are formed (e.g. Copper). The metal lines are used to connect the devices per given circuit design. The wafer can then be cut into small portions and packaged into a module that can eventually go into an electronic device.

The current disclosure discusses the back end of the line cycle while forming metal lines. The same method and structure, however, can be used at other stages of process fabrication where void detection in dielectrics is key. As an example, when fabricating a transistor with different connections, the metal lines can be used to build up the structure. Because the structure cannot be free standing, a filler material can be disposed in between the metal lines to make the structure solid. The filler material is usually a dielectric (e.g., oxide, polymer materials with varied dielectric constants, etc.). Varied dielectric material selection can be used to isolate the current experienced by the metal lines and ensure that a parasitic capacitance between the metal lines is small. As transistors are being fabricated in smaller dimensions, the distance between the metal lines also becomes smaller.

However, the distance between the metal lines is not always constant (e.g., 500 nanometers apart, 1400 nanometers apart, etc.) during transistor fabrication. Because the dielectric material does not always fill the gaps between the metal lines evenly, sometimes a void is created within the dielectric material when the dielectric material is being used to fill gaps between the metal lines. Therefore, void (e.g., bubbles) detection is important.

For example, if a dielectric material with a void is exposed to a reactive ion etch that is used to remove part of the dielectric material, when the ions hit a voided region within the dielectric material, the ions will quickly pass through the voided region. Thus, the rate of removal of the dielectric material in the voided region is not the same as the rate of removal for a dielectric material that does not contain any voided regions. Thus voids can lead to inconsistencies between different structures on the same wafer. This disclosure discusses a means to characterize and quantify the voids within dielectric materials for a given structure.

The illustration shows an example of one way to fabricate a back end structure. It is to be understood that the present disclosure can be described in terms of a given illustrative architecture comprising an integrated circuit; however, other architectures, structures, materials and process features and steps can be varied within the scope of the present invention.

It should also be understood that when an element such as an interface layer, load, etc. is referred to as being "on" or "over" another element, it can be directly on the other element or intervening elements can also be present. In contrast, when an element is referred to as being "directly on" or "directly over" another element, there are no intervening elements present. It should also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

FIG. 1 illustrates a non-limiting side view of an interlayer dielectric on a silicon substrate in accordance with one or more embodiments described herein. Facilitating a dielectric gap fill evaluation can comprise detecting the performance of the dielectric material and then determining a void formation within a dielectric gap fill material. Determining this information prior to using a specific dielectric material can dictate the current flow for a transistor. Therefore, measuring the percentage of the void can comprise utilizing a bottom electrode and a top electrode to determine the percentage of voids for an apparatus 100. The first step to determining this information is to deposit a dielectric material on a substrate 102 (e.g., bare silicon wafer, etc.) as depicted in FIG. 1.

Figure 2B:
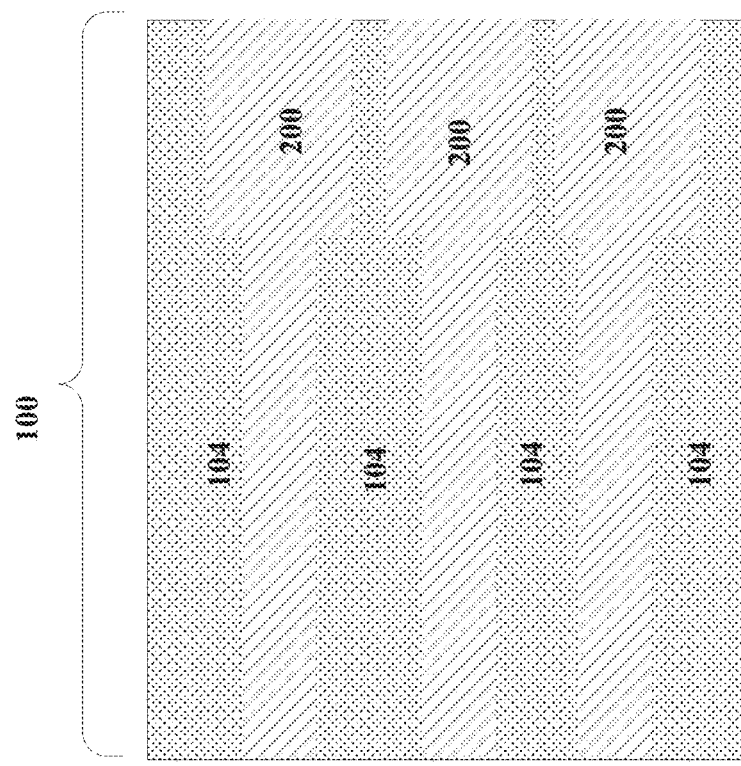
FIGS. 2A and 2B illustrate a non-limiting side view of the interlayer dielectric and a non-limiting top view of the interlayer dielectric after a patterning process, respectively, in accordance with one or more embodiments described herein.
Figure 2A:
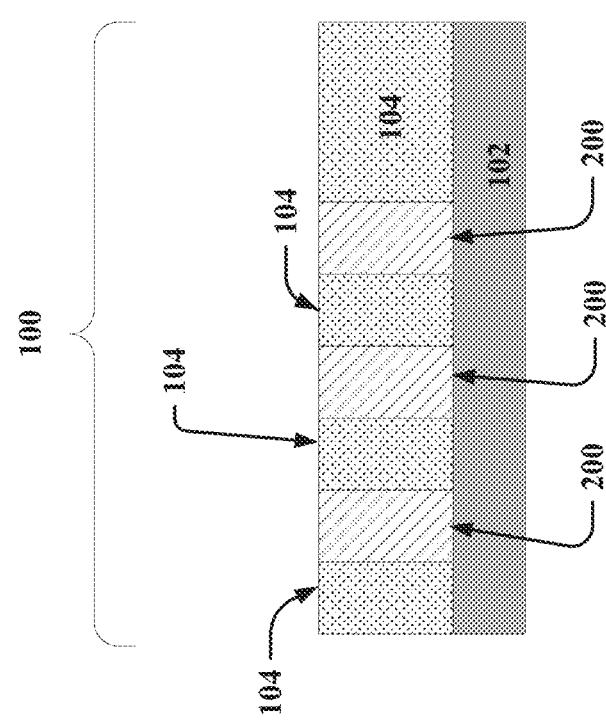

FIGS. 2A and 2B illustrate a non-limiting side view of the interlayer dielectric and a non-limiting top view of the interlayer dielectric after a patterning process, respectively, in accordance with one or more embodiments described herein. Repetitive description of like elements employed in other embodiments described herein is omitted for sake of brevity.

FIG. 2A depicts a side view of the apparatus 100 after a bottom electrode has been formed. To form the bottom electrode, the apparatus 100 can undergo a lithography process to pattern the dielectric material 104. After the dielectric material 104 is patterned, the patterned areas of the dielectric material 104 can be filled with Copper, Aluminum, Tungsten or some other conducting material to create a bottom electrode 200. Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light. The exposed regions are then washed away by a developer solution. After etching or other processing, the remaining photoresist is removed. The etching process can include a dry etch (e.g., reactive ion etching, plasma etching, ion beam etching, or laser ablation). The etching process can alternatively include a wet chemical etch (e.g., with potassium hydroxide, or sulfuric acid and hydrogen peroxide). In some exemplary embodiments, both dry etching and wet chemical etching processes can be used. After transferring the pattern, the patterned photoresist is removed utilizing resist stripping processes, such as wet chemical clean or ashing. Ashing can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof. Patterning also includes electron-beam lithography, nanoimprint lithography, and reactive ion etching.

Figure 3B:
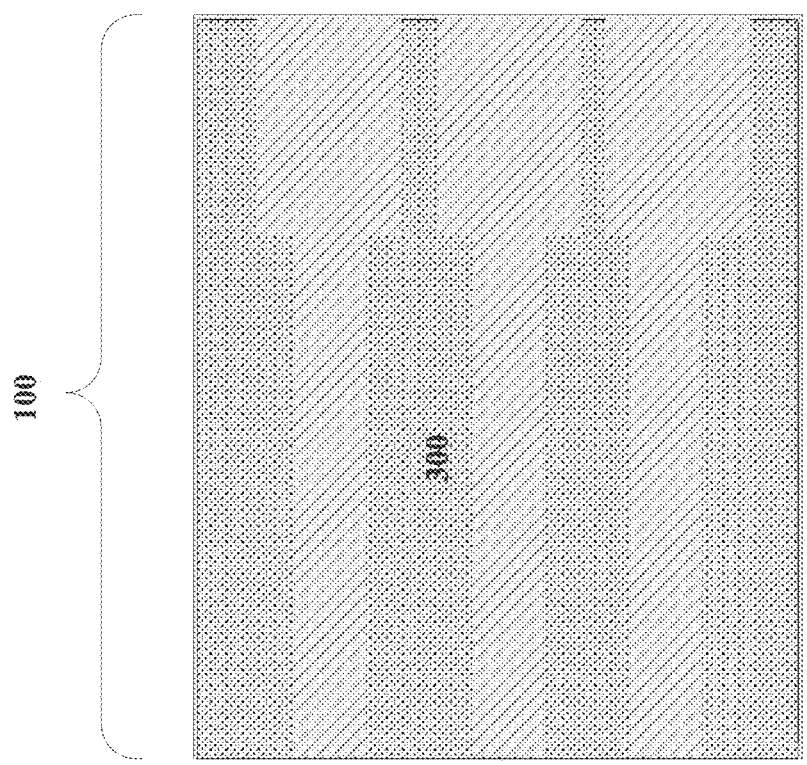
FIGS. 3A and 3B illustrate a non-limiting side view of the interlayer dielectric and a non-limiting top view of the interlayer dielectric comprising a gap fill substrate, respectively, in accordance with one or more embodiments described herein.
Figure 3A:
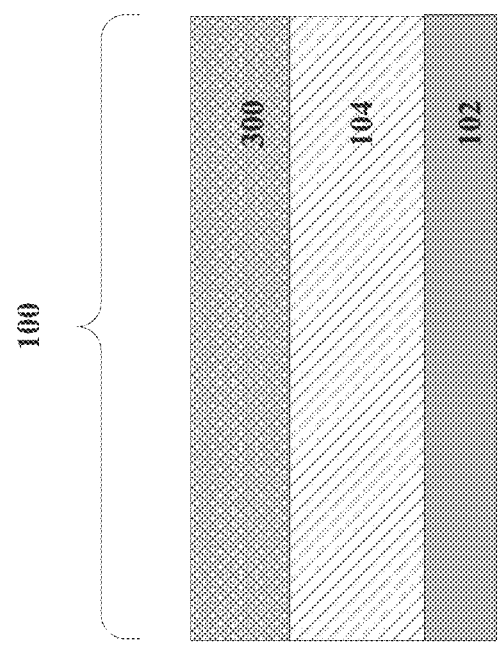

The bottom electrode 200 can be used as a connector for a paired connection as will be discussed later. Thereafter the surface of the apparatus 100 can be smoothed via a removal process. Removal is any process that removes material from the surface: examples include etch processes (either wet or dry), and chemical-mechanical planarization (CMP), etc. FIG. 2B depicts a top view of the apparatus 100 comprising the bottom electrodes 200 and the dielectric material 104 after the patterning process FIGS. 3A and 3B illustrate a non-limiting side view of the interlayer dielectric and a non-limiting top view of the interlayer dielectric comprising a gap fill substrate, respectively, in accordance with one or more embodiments described herein. Repetitive description of like elements employed in other embodiments described herein is omitted for sake of brevity.

FIG. 3A depicts a side view of a gap fill substrate 300 (e.g., oxide, nitride, low dielectric constant materials) deposited on a channel formed by the bottom electrode 200. Additionally, FIG. 3B depicts the gap fill film 300 deposited on the entire smoothed surface (e.g., the dielectric materials 104 and the bottom electrodes 200) of the apparatus 100. FIGS. 4A, 4B, and 4C illustrate non-limiting side views of the interlayer dielectric and a non-limiting top view of the interlayer dielectric comprising trenches, respectively, in accordance with one or more embodiments described herein. Repetitive description of like elements employed in other embodiments described herein is omitted for sake of brevity.

FIG. 4A depicts the apparatus 100 after a second patterning process that forms various pitches (e.g., pitch 1, pitch 2, line trenches, etc.) on the apparatus 100 in preparation for a dielectric gap fill material (not shown). The second patterning can be performed via a lithographic process as described above. The gap fill substrate 300 is patterned above the bottom electrodes as shown in FIG. 4A and the gap fill substrate 300 is patterned above the dielectric material 104 in FIG. 4B. FIG. 4C depicts a top view of the apparatus 100 wherein the various pitches (e.g., pitch 1 and pitch 2) of various widths can comprise the dielectric materials 104 and the bottom electrodes 200.

Figure 5B:
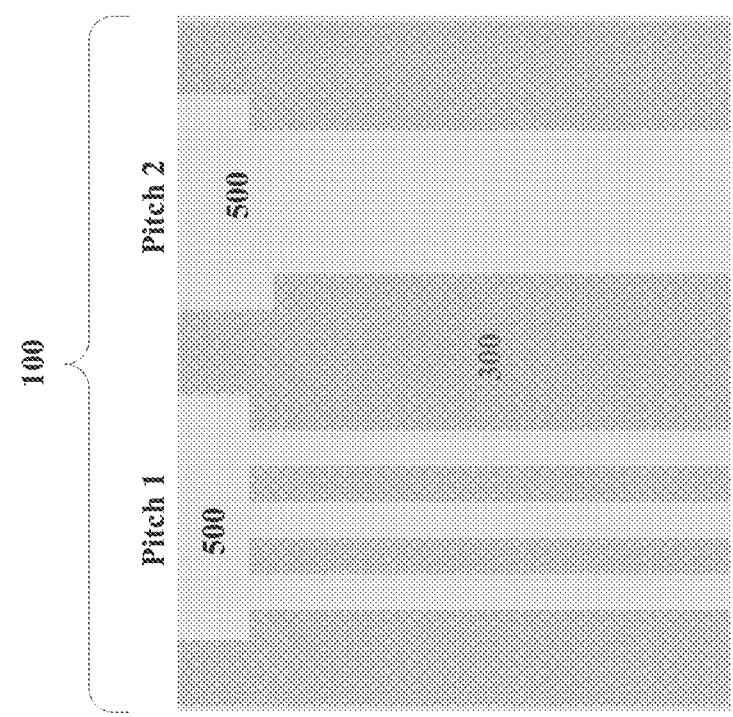
FIGS. 5A and 5B illustrate a non-limiting side view of the interlayer dielectric and a non-limiting top view of the interlayer dielectric comprising a gap fill material, respectively, in accordance with one or more embodiments described herein.
Figure 5A:
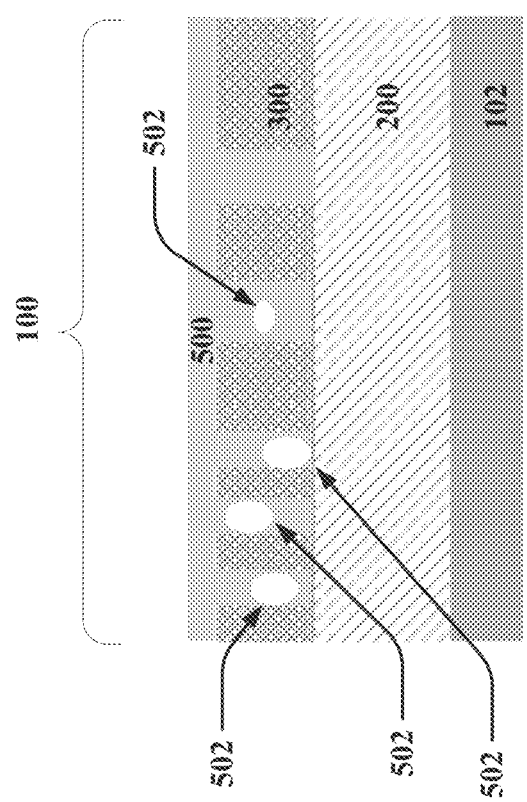

FIGS. 5A and 5B illustrate a non-limiting side view of the interlayer dielectric and a non-limiting top view of the interlayer dielectric comprising a gap fill material, respectively, in accordance with one or more embodiments described herein. Repetitive description of like elements employed in other embodiments described herein is omitted for sake of brevity.

FIG. 5A depicts a side view of the apparatus 100, wherein a dielectric gap fill candidate material 500 is deposited on the gap fill substrate 300 and the bottom electrodes 200. The dielectric gap fill candidate material 500 (e.g., organic materials comprised of carbon, hydrogen and/or oxygen; silicon containing organic materials; flowable oxide; nitride; amorphous silicon films) can be deposited or spun onto the gap fill substrate 300 and the bottom electrodes 200. Several processes can also be used to spin on or deposit the dielectric gap fill candidate material 500 on the gap fill substrate 300. Deposition is any process that grows, coats, or otherwise transfers a material onto a substrate. Available technologies include, but are not limited to, dielectric spin-on, thermal oxidation, physical vapor deposition (PVD), chemical vapor deposition (CVD), electrochemical deposition (ECD), molecular beam epitaxy (MBE) and more recently, atomic layer deposition (ALD) among others.

The dielectric gap fill candidate material 500 can be formed or deposited by a mold, a drawdown technique, or spin coating. A drawdown technique can stretch the dielectric gap fill candidate material 500 by pulling it away faster than the natural production rate of the dielectric gap fill candidate material 500 without the pulling. Spin coating is a procedure, which can be used to uniformly deposit thin layers of the dielectric gap fill candidate material 500 onto the gap fill substrate 300. Usually a small amount of coating material can be applied on the center of the gap fill substrate 300, which can be either spinning at low speed or not spinning at all. The gap fill substrate 300 can then be rotated at high speed in order to spread the dielectric gap fill candidate material 500 by centrifugal force. Rotation can continue until the desired thickness of the dielectric gap fill candidate material 500 is achieved. The higher the angular speed of spinning, the thinner the dielectric gap fill candidate material 500 layer, which can usually be a thickness below ten nanometers.

Due to inconsistencies in the dielectric gap fill candidate material 500, voids 502 can form within the patterned structures of the gap fill substrate 300. FIG. 5B depicts a top view of the apparatus 100 after the dielectric gap fill candidate material 500 has been deposited or spun on the gap fill substrate 300 and the bottom electrodes 200. It should be noted that the voids 502 are not shown from the top view because the voids 502 are below the top surface of the apparatus 100.

FIGS. 6A and 6B illustrate a non-limiting side view of the interlayer dielectric and a non-limiting top view of the interlayer dielectric comprising an etched gap fill material, respectively, in accordance with one or more embodiments described herein. Repetitive description of like elements employed in other embodiments described herein is omitted for sake of brevity.

After the dielectric gap fill candidate material 500 is deposited or spun onto the gap fill substrate 300, the dielectric gap fill candidate material 500 can be etched down to expose the voids within the dielectric gap fill candidate material 500 as depicted in a side view of FIG. 6A. Depending on the size and frequency in which the voids 502 occur, the etching process can expose the bottom electrodes 200 as a function of time. The longer the etching process takes place, the higher propensity for the voids 502 to be exposed. Thus, pitches with the highest number and/or greater size of voids 502 will be etched down to the bottom electrodes 200 more quickly than pitches with a fewer number and/or smaller size of voids 502. Consequently, it can take longer for voids 502 that are closer to the bottom electrodes 200 to be exposed than voids 502 that are closer to the top of the gap fill substrate 300 surface. For example, at time t1, only one void 502 near the top of the gap fill substrate 300 surface can be exposed. However, at time t2, several voids 502 that are closer to the bottom electrodes 200 can be exposed. After the voids 502 have been exposed via the etching process, the bottom electrodes 200 can be viewed, through the exposed voids 600, from a top view of the apparatus 100 as depicted by FIG. 6B.

FIGS. 7A, 7B, and 7C illustrate non-limiting side views of the interlayer dielectric and a non-limiting top view of the interlayer dielectric comprising copper fillings, respectively, in accordance with one or more embodiments described herein. Repetitive description of like elements employed in other embodiments described herein is omitted for sake of brevity.

After the exposed voids 600 have provided a path from the top of the apparatus 100 to the bottom electrodes 200, the exposed voids 600 can be filled with additional conductive material 700 to fabricate one or more top electrodes 702 and to form a conductive pathway between the top electrodes 702 and the bottom electrodes 200. The top surface of the apparatus can also undergo a smoothing process via a second chemical-mechanical planarization process to form the top electrodes 702. FIG. 7A depicts a side view wherein some conductive pathways 704 have been created by the voids that were closest to the bottom electrodes 200 or large enough to bridge the gap between the bottom electrodes 200 and the top surface of the apparatus 100. Alternatively, areas where the dielectric gap fill candidate material 500 did not comprise a void 502, the top electrodes 702 are not connected to the bottom electrodes 200 via the additional conductive material 700. Because the dielectric gap fill candidate material 500 is not good conductor, current will not be able to pass through the dielectric gap fill candidate material 500 that does not comprise a void. The size of the copper can also be taken into account because different sizes of copper allow for current flow at different rates.

Consequently, the apparatus 100 can comprise bottom electrodes 200, a gap filled in the middle by the additional conductive material 700, and one or more top electrodes 702. The bottom electrodes 200 can be separated from the top electrodes 702, by the dielectric gap fill candidate material 500, wherein the top electrodes are adjacent to the top surface of the gap fill substrate 300.

FIG. 7B depicts a side view of the top electrode 702 being connected to the bottom electrodes 200 via the additional conductive material 700. However, as seen in FIG. 7B, the dielectric gap fill candidate material 500 can separate the top electrodes 702 from the bottom electrodes 200 found within the trenches of the dielectric material 104.

FIG. 7C depicts a top view of the apparatus 100 wherein the top surface of the apparatus 100 comprises top electrodes 702 and the gap fill substrate 300. Because contacts have been formed from the top electrodes 702 to the bottom electrodes 200 within one or more pitches of the apparatus, a leakage current can be measured for a given pitch of the one or more pitches by applying a voltage to the top electrode 702 and the bottom electrodes 200 to determine how much current flows through. For example, the leakage current can be measured at pads 1 and 2 for the apparatus 100 as shown in FIG. 7C.

Figure 8:
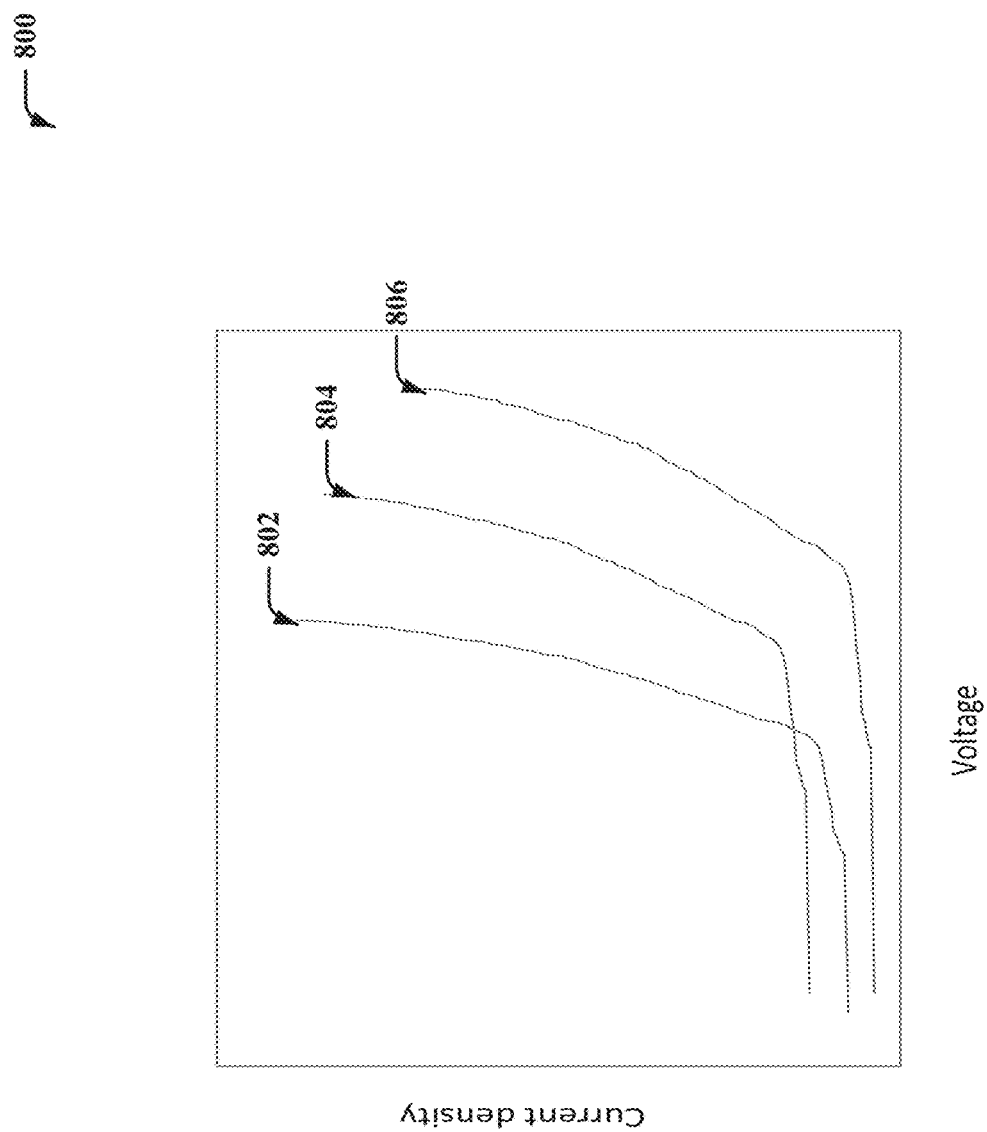
FIG. 8 illustrates a non-limiting leakage current graph in accordance with one or more embodiments described herein.

FIG. 8 illustrates a non-limiting leakage current graph 800 in accordance with one or more embodiments described herein. Repetitive description of like elements employed in other embodiments described herein is omitted for sake of brevity.

When plotting current density as a function of a voltage, a voltage can be applied to the top electrode 702 and the bottom electrodes 200 to determine how much current flows through. In cases with no voids 502 as represented by line 806 of the graph 800, current cannot pass through a channel of the apparatus 100 until the voltage is high enough to break the dielectric gap fill candidate material 500. However, in cases where there is a void 502, represented by lines 802, 804, based on the fraction of voids, varying amounts of current can be passed through the additional conductive material 700 via the gap filled middle.

Figure 9:
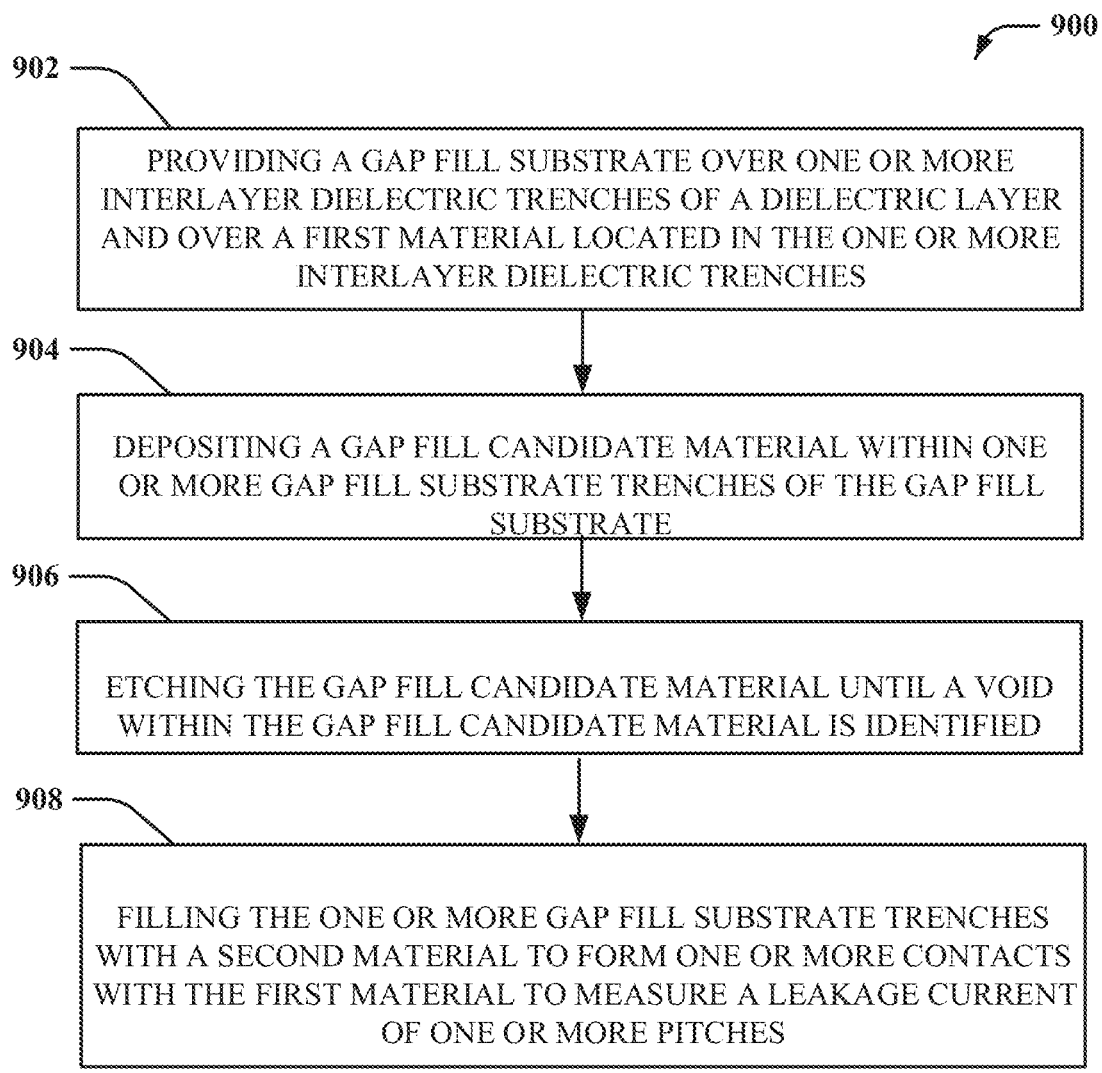
FIG. 9 illustrates a flow diagram of an example, non-limiting method for facilitating a dielectric gap fill evaluation in accordance with one or more embodiments described herein.

FIG. 9 illustrates a flow diagram of an example, non-limiting method 900 for facilitating a dielectric gap fill evaluation in accordance with one or more embodiments described herein. Repetitive description of like elements employed in other embodiments described herein is omitted for sake of brevity.

In one embodiment, the method can comprise, providing a gap fill substrate (e.g., oxide nitride, etc.) over one or more interlayer dielectric trenches of a dielectric layer (e.g., dielectric material 104) and over a first material (e.g., copper, etc.) located in the one or more interlayer dielectric trenches at element 902. At element 904, the method can comprise depositing a gap fill candidate material 500 within one or more gap fill substrate trenches of the gap fill substrate (e.g., oxide nitride, etc.) prior to etching the gap fill candidate material 500 until a void 502 within the gap fill candidate material 500 is identified at element 906. Furthermore, at element 908, the method can comprise filling the one or more gap fill substrate trenches with a second material (e.g., copper, additional conductive material 700, etc.) to form one or more contacts with the first material (e.g., copper, etc.) to measure a leakage current of one or more pitches.

Figure 10:
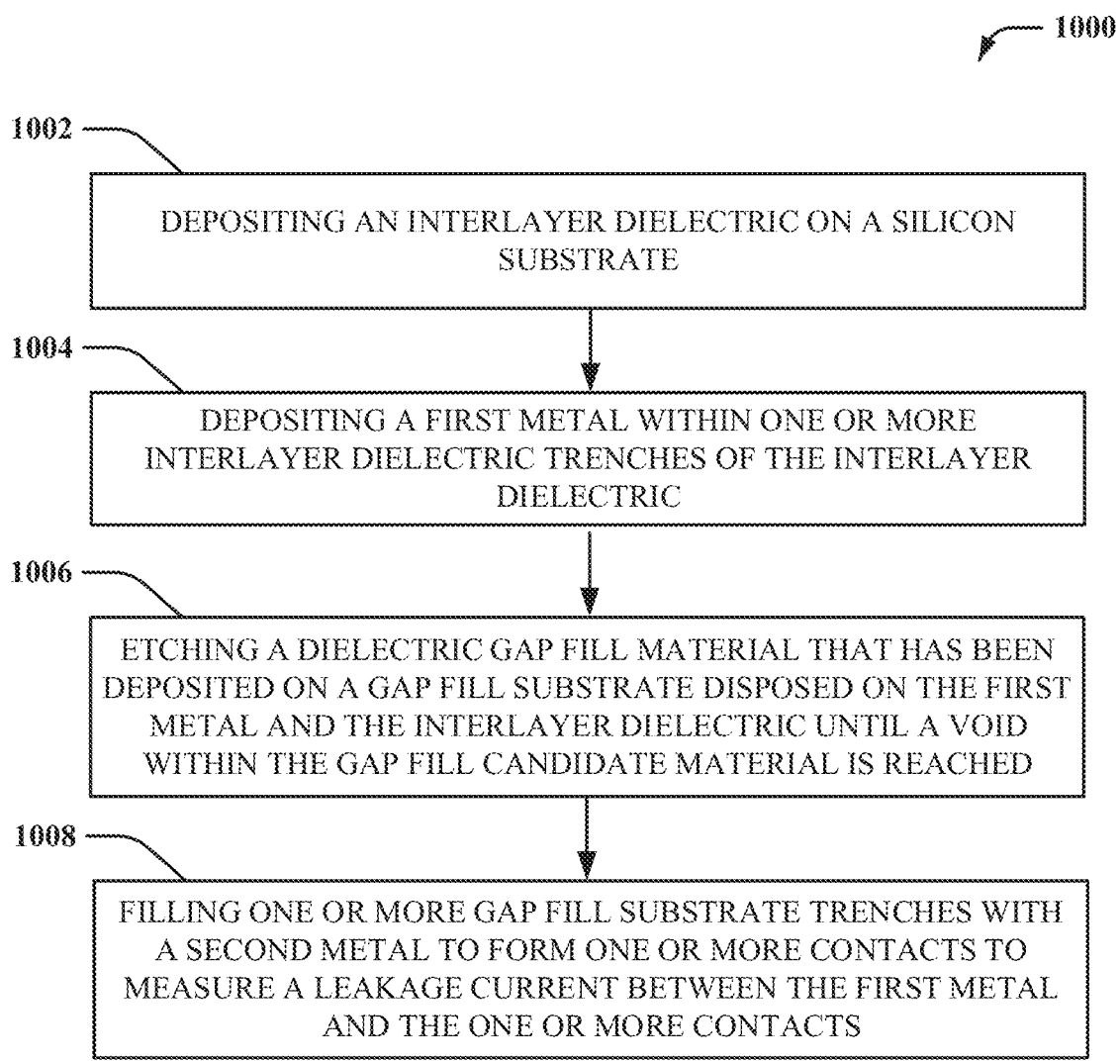
FIG. 10 illustrates a flow diagram of another example, non-limiting method for facilitating a dielectric gap fill evaluation in accordance with one or more embodiments described herein.

FIG. 10 illustrates a flow diagram of another example, non-limiting method 1000 for facilitating a dielectric gap fill evaluation in accordance with one or more embodiments described herein. Repetitive description of like elements employed in other embodiments described herein is omitted for sake of brevity.

In another embodiment, another method can comprise depositing an interlayer dielectric (e.g., dielectric material 104) on a silicon substrate (e.g., silicon substrate 102) at element 1002. Additionally, the method can comprise depositing a first metal (e.g., copper, etc.) within one or more interlayer dielectric trenches of the interlayer dielectric (e.g., dielectric material 104) at element 1004. At element 1006, the method can comprise etching a gap fill material, (e.g., gap fill candidate material 500) that has been deposited on a gap fill substrate (e.g., oxide nitride, etc.) disposed on the first metal (e.g., copper, etc.) and the interlayer dielectric (e.g., dielectric material 104), until a void (e.g., void 502) within the gap fill candidate material 500 is reached. Furthermore, the method can comprise filling one or more gap fill substrate trenches with a second metal (e.g., copper, additional conductive material 700, etc.) to form one or more contacts to measure a leakage current between the first metal (e.g., copper, etc.) and the one or more contacts at element 1008.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a silicon substrate;
   an interlayer dielectric disposed on the silicon substrate;
   a first metal within one or more first trenches of the interlayer dielectric;
   a gap fill substrate disposed on the first metal and the interlayer dielectric;
   a dielectric gap fill material disposed within one or more second trenches of the gap fill substrate, wherein the dielectric gap fill material within the one or more second trenches comprises a void that exposes part of the first material; and
   a second metal, wherein the second metal fills the void and forms one or more contacts with the first metal.

2. The apparatus of claim 1, wherein the first metal is a copper metal.

3. The apparatus of claim 1, wherein the gap fill substrate is a nitride gap fill substrate.

4. The apparatus of claim 1, wherein the dielectric gap fill material is disposed on the gap fill substrate.

5. The apparatus of claim 1, wherein the dielectric gap fill material is disposed on the interlayer dielectric.

6. The apparatus of claim 1, wherein the dielectric gap fill material is disposed on the first metal.

7. The apparatus of claim 1, further comprising:
   one or more pitches that comprise the gap fill substrate and the one or more second trenches of the gap fill substrate.

8. The apparatus of claim 1, wherein the second metal forms a contact to the first metal.

9. The apparatus of claim 1, wherein the second metal forms a contact to the first metal.

10. The apparatus of claim 1, wherein the second metal is a copper metal.

11. The apparatus of claim 1, wherein the dielectric gap fill material comprises an organic material.

12. The apparatus of claim 1, wherein the dielectric gap fill material comprises an amorphous silicon film.

13. The apparatus of claim 1, wherein the dielectric gap fill material comprises a flowable oxide.

14. The apparatus of claim 1, wherein the dielectric gap fill material comprises a nitride.

15. The apparatus of claim 1, wherein the dielectric gap fill material comprises carbon.

16. The apparatus of claim 1, wherein the dielectric gap fill material comprises hydrogen.

17. The apparatus of claim 1, wherein the dielectric gap fill material comprises oxygen.

18. The apparatus of claim 1, wherein the dielectric gap fill material comprises silicon comprising organic material.

19. An apparatus comprising:
   a silicon substrate;
   an interlayer dielectric disposed on the silicon substrate;
   a first metal within one or more first trenches of the interlayer dielectric;
   a gap fill substrate disposed on the first metal and the interlayer dielectric;
   a dielectric gap fill material disposed within one or more second trenches of the gap fill substrate, wherein the dielectric gap fill material comprises a nitride; and
   a second metal, wherein the second metal forms one or more contacts with the first metal.

20. An apparatus comprising:
   a silicon substrate;
   an interlayer dielectric disposed on the silicon substrate;
   a first metal within one or more first trenches of the interlayer dielectric;
   a gap fill substrate disposed on the first metal and the interlayer dielectric;
   a dielectric gap fill material disposed within one or more second trenches of the gap fill substrate, wherein the dielectric gap fill material comprises carbon; and
   a second metal, wherein the second metal forms one or more contacts with the first metal.

* * * * *